(12) United States Patent
Paik et al.

(10) Patent No.: US 11,550,390 B2
(45) Date of Patent: Jan. 10, 2023

(54) WEARABLE DEVICE AND WEARABLE SYSTEM

(71) Applicants: Hyundai Motor Company, Seoul (KR); Kia Motors Corporation, Seoul (KR); Research & Business Foundation SUNGKYUNKWAN UNIVERSITY, Suwon-si (KR)

(72) Inventors: Soon Kwon Paik, Yongin-si (KR); Tae Il Kim, Pyeongtaek-si (KR); Joo Hwan Shin, Suwon-si (KR)

(73) Assignees: Hyundai Motor Company, Seoul (KR); Kia Motors Corporation, Seoul (KR); Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 62 days.

(21) Appl. No.: 17/000,873

(22) Filed: Aug. 24, 2020

(65) Prior Publication Data

US 2021/0382553 A1 Dec. 9, 2021

(30) Foreign Application Priority Data

Jun. 9, 2020 (KR) .................. 10-2020-0069631

(51) Int. Cl.
*G06F 3/01* (2006.01)
*G06F 1/16* (2006.01)
*H04W 4/40* (2018.01)
*G05D 1/00* (2006.01)
*H05K 1/18* (2006.01)

(52) U.S. Cl.
CPC ........... *G06F 3/015* (2013.01); *G05D 1/0016* (2013.01); *G05D 1/0022* (2013.01); *G06F 1/163* (2013.01); *H04W 4/40* (2018.02); *H05K 1/189* (2013.01)

(58) Field of Classification Search
CPC .... G06F 3/015; G06F 1/163; G06F 2203/011; G06F 3/011; G05D 1/0016; G05D 1/0022; H04W 4/40; H05K 1/189; H05K 2201/10189; H05K 1/0283; H05K 1/147; H05K 3/323; B60K 35/00; B60W 40/08; B60W 2040/0872; B60R 16/02
See application file for complete search history.

(56) References Cited

U.S. PATENT DOCUMENTS

| | | | |
|---|---|---|---|
| 10,722,160 B2* | 7/2020 | Wang | A61B 5/14532 |
| 11,109,796 B2* | 9/2021 | Han | H01L 41/187 |
| 11,122,982 B2* | 9/2021 | Wang | A61B 5/0205 |
| 2008/0032523 A1* | 2/2008 | Kuo | H05K 3/366 439/75 |
| 2017/0077633 A1* | 3/2017 | Hricik | H01R 13/2414 |
| 2017/0271799 A1* | 9/2017 | Axelowitz | H01R 12/721 |
| 2018/0261940 A1* | 9/2018 | Sherman | H01R 12/714 |
| 2019/0199022 A1* | 6/2019 | Masuda | H01R 12/714 |
| 2019/0267732 A1* | 8/2019 | Buck | H01R 12/85 |

(Continued)

*Primary Examiner* — Grant Sitta
(74) *Attorney, Agent, or Firm* — Morgan, Lewis & Bockius LLP

(57) ABSTRACT

A wearable device includes a skin-attachable device to be attached to a skin of a user to acquire user data, an electronic device that supplies power to the skin-attachable device, and a connection device including a first cable connected to the skin-attachable device and a second cable connected to the first cable and detachably attached to the electronic device.

13 Claims, 7 Drawing Sheets

(56) References Cited

U.S. PATENT DOCUMENTS

| | | | |
|---|---|---|---|
| 2020/0085299 A1* | 3/2020 | Xu | H01L 24/81 |
| 2020/0089320 A1* | 3/2020 | Bae | H01B 7/06 |
| 2020/0235515 A1* | 7/2020 | Tsai | H01R 13/426 |
| 2020/0288999 A1* | 9/2020 | Lasarov | A61B 5/7475 |
| 2020/0337641 A1* | 10/2020 | Wang | A61B 5/1486 |
| 2021/0022686 A1* | 1/2021 | Rogers | A61B 5/7278 |
| 2021/0105901 A1* | 4/2021 | Jang | H05K 3/361 |
| 2021/0113099 A1* | 4/2021 | Rogers | A61B 5/4803 |
| 2021/0141453 A1* | 5/2021 | Miller, III | A61B 5/369 |
| 2021/0145352 A1* | 5/2021 | Rogers | A61B 5/7225 |
| 2021/0194164 A1* | 6/2021 | Epitaux | H01R 13/631 |
| 2021/0256246 A1* | 8/2021 | Dagdeviren | G06V 40/174 |
| 2021/0365105 A1* | 11/2021 | Iliffe-Moon | G06F 3/011 |
| 2022/0006220 A1* | 1/2022 | Kim | H01M 10/425 |

* cited by examiner

WEARABLE DEVICE AND WEARABLE SYSTEM

CROSS-REFERENCE TO RELATED APPLICATION

The present application claims priority to Korean Patent Application No. 10-2020-0069631, filed on Jun. 9, 2020, the entire contents of which is incorporated herein for all purposes by this reference.

BACKGROUND OF THE INVENTION

Field of the Invention

The present invention relates to a wearable device and a wearable device system.

Description of Related Art

With the development of wearable device technology and ergonomic technology, wearable devices including various patch-type sensors or elements attached to a human body to perform functions have been developed. In particular, wearable devices including elements attachable to a skin have a characteristic of being well bent or stretched according to the flexible and curved characteristics of human body to be easily attached to the human body, and are being developed in a thin film form.

Such elements which may be attached to the skin perform functions themselves, but may be operated normally only when they are electrically connected to electronic devices including electronic devices (measurement devices, portable terminals). Accordingly, there is a need to develop a wearable device which may be safely and electrically connected without affecting the human body when elements attachable to the skin are connected to an external device.

The information included in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing a wearable device and a wearable system configured for easily electrically connecting to electronic devices.

The technical problems to be solved by the present inventive concept are not limited to the aforementioned problems, and any other technical problems not mentioned herein will be clearly understood from the following description by those skilled in the art to which various exemplary embodiments of the present invention pertains.

According to various aspects of the present invention, a wearable device includes a skin-attachable device to be attached to a skin of a user to acquire user data, an electronic device that supplies power to the skin-attachable device, and a connection device including a first cable connected to the skin-attachable device and a second cable connected to the first cable and detachably attached to the electronic device.

The first cable may include an Anisotropic Conductive Film (ACF) cable.

The second cable may include a Flexible Printed Circuit (FPC) cable.

The second cable may be connected to a FPCB connector.

The wearable device may further include a surface-mounted device (SMD) connector detachably attached to the FPCB connector.

The electronic device may include a Printed Circuit Board (PCB) provided with the SMD connector.

The electronic device may perform wireless communication with an external device to transmit the user data to the external device.

The user data may include brain waves.

According to various aspects of the present invention, a wearable system may include a wearable device including a skin-attachable device that acquires user data and an electronic device connected to the skin-attachable device, and a vehicle that receives the user data from the wearable device and controls a vehicle terminal based on the user data.

The wearable device may include a first cable connected to the skin-attachable device and a second cable connected to the first cable and detachably attached to the electronic device.

The first cable may include an Anisotropic Conductive Film (ACF) cable.

The second cable may include a Flexible Printed Circuit (FPC) cable.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
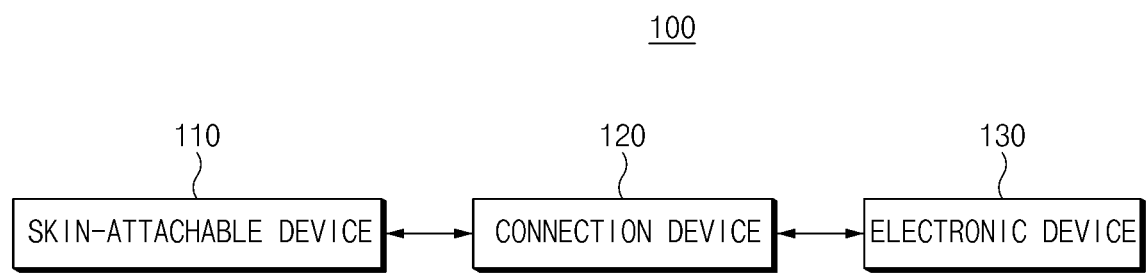
FIG. 1 is a schematic diagram showing a configuration of a wearable device according to various exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, various exemplary embodiments of the present invention will be described in detail with reference to the exemplary drawings. In adding the reference numerals to the components of each drawing, it may be noted that the identical or equivalent component is designated by the identical numeral even when they are displayed on other drawings. Furthermore, in describing the exemplary embodiment of the present invention, a detailed description of well-known features or functions will be ruled out in order not to unnecessarily obscure the gist of the present invention.

In describing the components of the exemplary embodiment according to various exemplary embodiments of the present invention, terms such as first, second, "A", "B", (a), (b), and the like may be used. These terms are merely intended to distinguish one component from another component, and the terms do not limit the nature, sequence or order of the constituent components. Unless otherwise defined, all terms used herein, including technical or scientific terms, have the same meanings as those generally understood by those skilled in the art to which various exemplary embodiments of the present invention pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

FIG. 1 is a schematic diagram showing a configuration of a wearable device according to various exemplary embodiments of the present invention;

As illustrated in FIG. 1, a wearable device 100 according to various exemplary embodiments of the present invention may include a skin-attachable device 110, a connection device 120, and an electronic device 130.

The skin-attachable device 110 may be attached to a skin of a user to obtain user data. According to various exemplary embodiments of the present invention, the skin-attachable device 110 may be implemented in a patch type. Here, the user data may include a bio signal, and for example, the bio signal may include heart rate, electrocardiogram, body temperature, sleep information, blood sugar, blood pressure, respiratory rate, brain waves, and the like.

The connection device 120 may include a first cable connected to the skin-attachable device 110, and may include a second cable connected to the first cable and detachably attached to the electronic device. The first cable may include an Anisotropic Conductive Film (ACF) cable, and the second cable may include a Flexible Printed Circuit (FPC) cable. The connection device 120 will be described in more detail with reference to FIG. 2.

The electronic device 130 may supply power to the skin-attachable device 110. Furthermore, the electronic device 130 may include a communication device and perform wireless communication with external devices.

Figure 2:
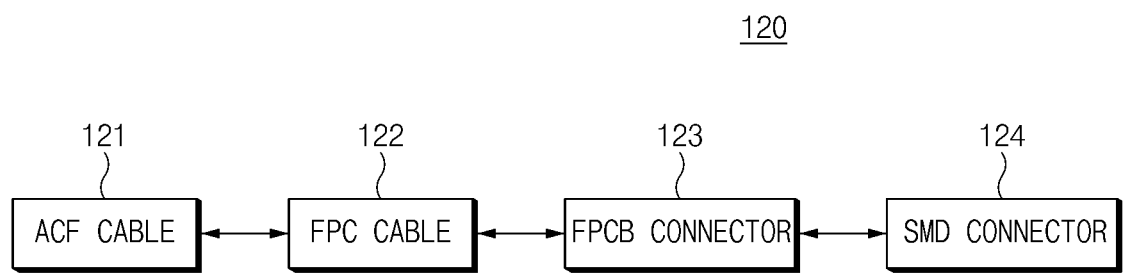
FIG. 2 is a schematic diagram showing a configuration of a connection device of a skin-attachable device according to various exemplary embodiments of the present invention.

FIG. 2 is a schematic diagram showing a configuration of a connection device of a skin-attachable device according to various exemplary embodiments of the present invention.

As illustrated in FIG. 2, a connection device of a skin-attachable device may include an ACF cable 121, an FPC cable 122, an FPCB connector 123 and a surface-mounted device (SMD) connector 124.

The ACF cable 121 may be connected to the skin-attachable element 110. The ACF cable 121 may be coupled to the skin-attachable device 110 at a temperature of 150 Celsius with a pressure which is weak enough not to damage a polymer film. Anisotropic Conductive Film (ACF) may be implemented in a film type by uniformly dispersing conductive particles in an adhesive organic material having insulating property. ACF may have conductivity in the thickness direction of the film and insulation in the surface direction of the film. That is, ACF refers to a polymer adhesive film having electrical anisotropy (conductivity is present in one surface and insulation is present in the other surface) and simultaneously having an adhesive property. Because the ACF cable 121 has a thickness of several to several tens of micrometers, the ACF cable 121 may be connected to the skin-attachable device in a harmless state to a human body without increasing the overall thickness. According to various exemplary embodiments of the present invention, when the skin-attachable device 110 is connected to the electronic device 130, the skin-attachable device 110 and the ACF cable 121 are connected, facilitating electrical connection without damage to the skin-attachable device 110 because a process of applying high temperature or high pressure is not performed in forming the wearable device 100.

One side of the FPC cable 122 may be connected to the ACF cable 121, and the other side may be connected to the SMD connector 124. To the present end, the other side of the FPC cable 122 may be provided with an Flexible Printed Circuit Board (FPCB) connector 123. The FPC cable 122 may mean circuit wiring formed on an insulating film, and three-dimensional wiring may be possible due to flexibility of the insulating film, reducing the size and weight of the wearable device 100. Furthermore, the FPCB connector 123 may be repeatedly attached to and detached from the SMD connector 124.

The SMD connector 124 may mean a surface mount device, and may be mounted on a printed circuit board (PCB) of the electronic device 130. The SMD connector 124 may be mounted on the PCB surface in a conventional manner because SMD connector 124 is configured to withstand high temperature and high pressure processes.

Figure 3:
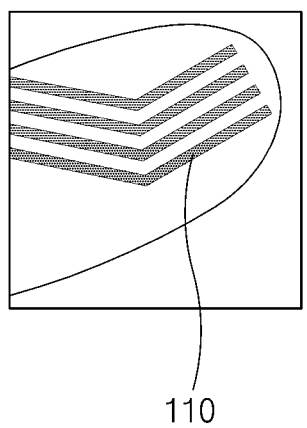
FIG. 3 is a diagram showing a skin-attachable device according to various exemplary embodiments of the present invention.
Figure 3:
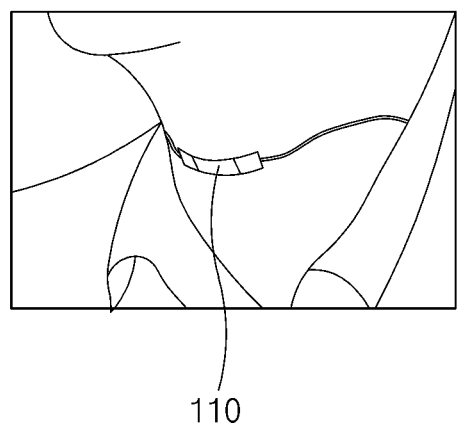

FIG. 3 is a diagram showing a skin-attachable device according to various exemplary embodiments of the present invention;

Referring to FIG. 3, the skin-attachable device 110 may be implemented by inserting circuit wiring in a stretchable material to be attachable to skin, and according to various exemplary embodiments of the present invention, the skin-attachable device 110 may be attached to a user's finger (fingerprint surface) or neck. However, the present invention is not limited thereto, and the skin-attachable device 110 may be attached to a site in which user data is easily acquired.

Figure 4:
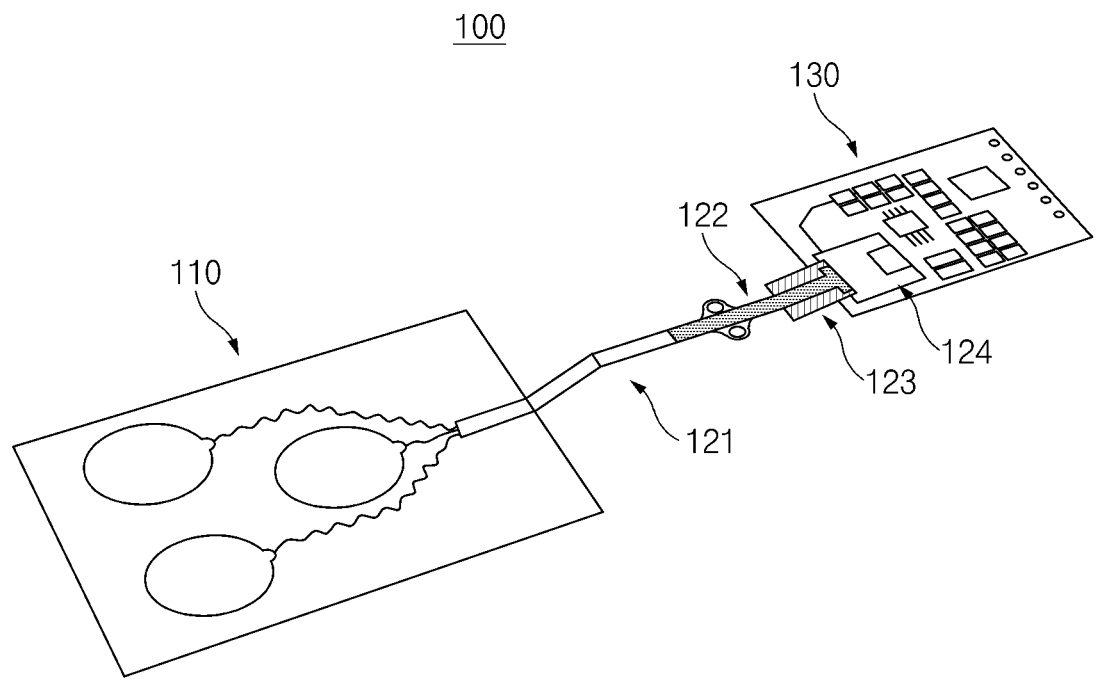
FIG. 4 is a diagram schematically showing a wearable device according to various exemplary embodiments of the present invention.

FIG. 4 is a diagram schematically showing a wearable device according to various exemplary embodiments of the present invention;

Referring to FIG. 4, the wearable device 100 according to various exemplary embodiments of the present invention may include the skin-attachable device 110, the ACF cable 121 connected to the skin-attachable device 110, the FPC cable 122 connected to the ACF cable 121, the FPCB connector 123 provided on one side of the FPC cable 122 and detachably attached to the SMD connector 124, the SMD connector 124 connected to the FPCB connector 123, and the electronic device 130 including a PCB on which the SMD connector 124 is mounted.

Figure 5:
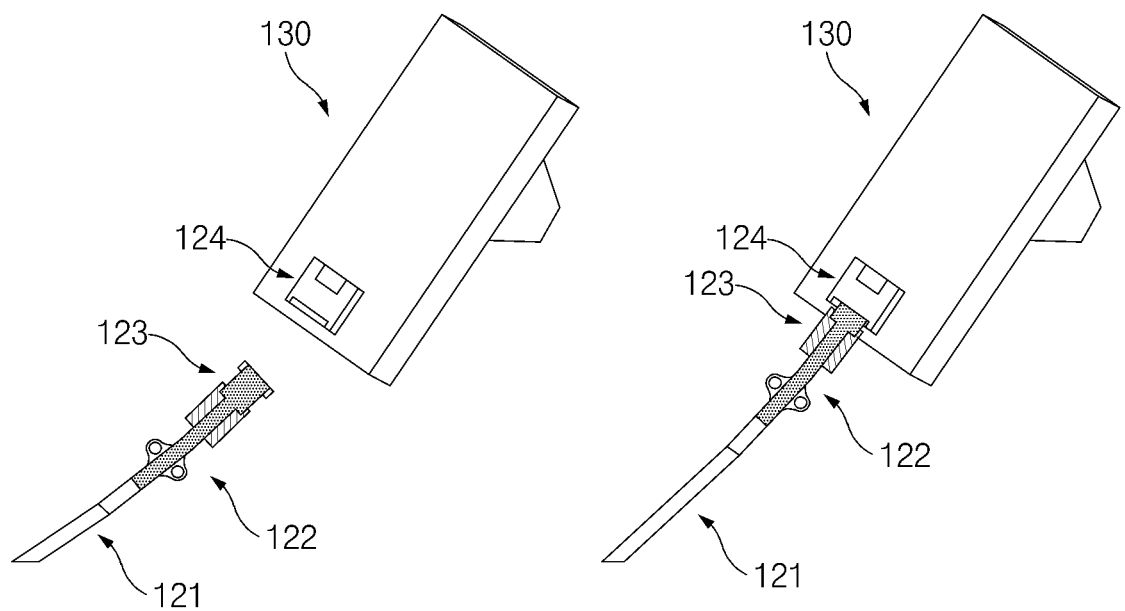
FIG. 5 is a diagram showing detachment and attachment of the connection device from and to the skin-attachable device according to various exemplary embodiments of the present invention.

FIG. 5 is a diagram showing detachment and attachment of the connection device from and to the skin-attachable device according to various exemplary embodiments of the present invention;

Referring to FIG. 5, the ACF cable 121 and the FPC cable 122 connected to the skin-attachable device 110 may be detached from or attached to the SMD connector 124 mounted on the PCB of the electronic device 130 by the FPCB connector 123.

Figure 6:
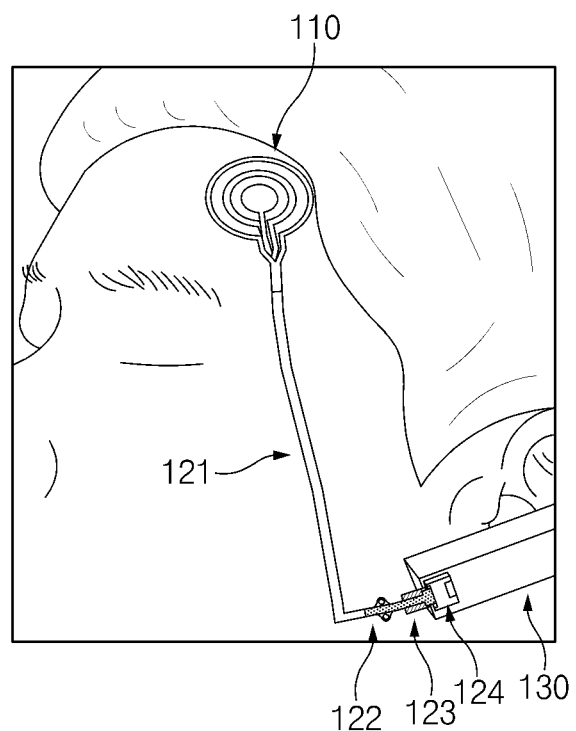
FIG. 6 is a diagram showing an attachment state of a wearable device according to various exemplary embodiments of the present invention.

FIG. 6 is a diagram showing an attachment state of a wearable device according to various exemplary embodiments of the present invention.

Referring to FIG. 6, the skin-attachable device 110 may be attached to a user's forehead to acquire user data. The electronic device 130 detachably attached to the skin-attachable device 110 by the ACF cable 121, the FPC cable 122, the FPCB connector 123, and the SMD connector 124 may perform wireless communication with an external device to transmit user data to the external device. Here, the electronic device may include a Bluetooth earphone, and the external device may include a user terminal, a vehicle, and the like.

Figure 7:
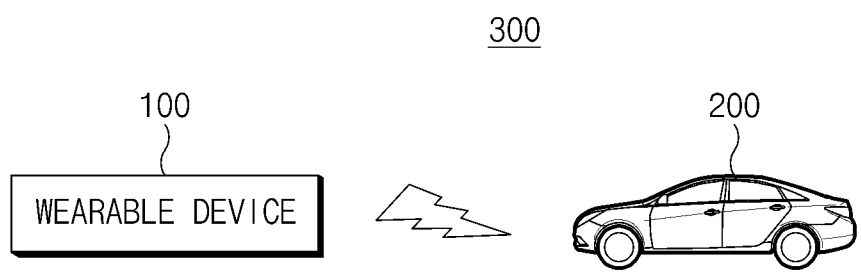
FIG. 7 is a schematic diagram showing the configuration of a wearable system according to various exemplary embodiments of the present invention.

FIG. 7 is a schematic diagram showing the configuration of a wearable system according to various exemplary embodiments of the present invention.

As illustrated in FIG. 7, a wearable system 300 according to various exemplary embodiments of the present invention may include the wearable device 100 and a vehicle 200 communicating with the wearable device 100.

The wearable device 100 may include a skin-attachable device that acquires user data and an electronic device connected to the skin-attachable device. The wearable device may include a first cable connected to the skin-attachable device, and a second cable connected to the first cable and detachably attached to the electronic device. The first cable may include an Anisotropic Conductive Film (ACF) cable, and the second cable may include a Flexible Printed Circuit (FPC) cable. The description provided with reference to FIGS. 1 to 6 may be referred to for the wearable device.

The vehicle 200 may receive user data from the wearable device 100 and control a vehicle terminal based on the user data. Here, the vehicle terminal may mean an electronic device mounted in the vehicle, and according to various exemplary embodiments of the present invention, the vehicle terminal may include a driving assistance device, a multimedia device, an air conditioning device, and a lighting device.

The above description is merely illustrative of the technical idea of the present invention, and various modifications and variations may be made without departing from the essential characteristics of the present invention by those skilled in the art to which various exemplary embodiments of the present invention pertains.

Therefore, the exemplary embodiments of the present invention are provided to explain the spirit and scope of the present invention, but not to limit them, so that the spirit and scope of the present invention is not limited by the embodiments. The scope of protection of the present invention may be interpreted by the following claims, and all technical ideas within the scope equivalent thereto may be construed as being included in the scope of the present invention.

The wearable device and wearable system according to various exemplary embodiments of the present invention may allow the skin-attachable device to be safely connected to the electronic device while being harmless to the human body, facilitating the skin-attachable device to operate normally.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A wearable device comprising:
a skin-attachable device to be attached to a skin of a user to acquire user data;
an electronic device configured to supply power to the skin-attachable device; and
a connection device including a first cable connected to the skin-attachable device and a second cable connected to the first cable and detachably attached to the electronic device,
wherein the electronic device includes a surface-mounted device (SMD) connector,
wherein the second cable is detachably attached to the electronic device through the SMD connector, and
wherein the surface-mounted device (SMD) connector is detachably attached to a Flexible Printed Circuit Board (FPCB) connector.

2. The wearable device of claim 1, wherein the first cable includes an Anisotropic Conductive Film (ACF) cable.

3. The wearable device of claim 1, wherein the second cable includes a Flexible Printed Circuit (FPC) cable.

4. The wearable device of claim 1, wherein the second cable is connected to the Flexible Printed Circuit Board (FPCB) connector.

5. The wearable device of claim 1, wherein the electronic device includes a Printed Circuit Board (PCB) provided with the SMD connector.

6. The wearable device of claim 1, wherein the electronic device is configured to perform wireless communication with an external device to transmit the user data to the external device.

7. The wearable device of claim 1, wherein the user data includes brain waves.

8. A wearable system comprising:

a wearable device including a skin-attachable device configured to acquire user data and an electronic device connected to the skin-attachable device; and a vehicle configured to receive the user data from the wearable device and control a vehicle terminal according to the user data, wherein the wearable device further includes a connection device having a first cable connected to the skin-attachable device and a second cable connected to the first cable and detachably attached to the electronic device, wherein the electronic device includes a surface-mounted device (SMD) connector, wherein the second cable is detachably attached to the electronic device through the SMD connector, and wherein the surface-mounted device (SMD) connector is detachably attached to a Flexible Printed Circuit Board (FPCB) connector.

9. The wearable system of claim 8, wherein the first cable include an Anisotropic Conductive Film (ACF) cable.

10. The wearable system of claim 8, wherein the second cable includes a Flexible Printed Circuit (FPC) cable.

11. The wearable system of claim 10, wherein the second cable is connected to the Flexible Printed Circuit Board (FPCB) connector.

12. The wearable system of claim 8, wherein the electronic device includes a Printed Circuit Board (PCB) provided with the SMD connector.

13. The wearable system of claim 8, wherein the electronic device is configured to perform wireless communication with an external device to transmit the user data to the external device.

* * * * *